United States Patent [19]

Hester et al.

[11] Patent Number: 5,235,335

[45] Date of Patent: Aug. 10, 1993

[54] CIRCUIT AND METHOD FOR TUNING CAPACITOR ARRAYS

[75] Inventors: Richard K. Hester, Whitewright, Tex.; Khen-Sang Tan, Singapore, Singapore; Michiel de Wit, Dallas, Tex.

[73] Assignee: Texas Instruments Incorporated, Dallas, Tex.

[21] Appl. No.: 892,447

[22] Filed: Jun. 2, 1992

[51] Int. Cl.$^5$ .................. H03M 1/10; H03M 1/68; H03M 1/12

[52] U.S. Cl. .................. 341/172; 341/156; 341/150; 341/145; 341/121

[58] Field of Search .............. 341/172, 150, 120, 145, 341/156, 121, 118

[56] References Cited

U.S. PATENT DOCUMENTS

| | | |
|---|---|---|
| 4,077,035 | 12/1978 | Yee . |
| 4,399,426 | 8/1983 | Tan . |
| 4,599,604 | 7/1986 | McKenzie et al. . |
| 4,709,225 | 11/1987 | Welland et al. . |
| 4,799,042 | 1/1989 | Confalonieri et al. ......... 341/172 X |
| 4,922,252 | 5/1990 | Draxelmayr et al. ......... 341/120 X |
| 4,999,633 | 3/1991 | Draxelmayr ................. 341/120 |

Primary Examiner—Sharon D. Logan
Attorney, Agent, or Firm—Ira S. Matsil; James C. Kesterson; Richard L. Donaldson

[57] ABSTRACT

A capacitor array circuit is disclosed herein. A main capacitor array includes at least a most significant array portion 12 and a least significant array portion 14. A coupling capacitor $C_C$ is formed between the two portions of the array. Typically, one plate of the coupling capacitor $C_C$ is coupled to a top plate of each of the capacitors in the least significant array portion 14 and a second plate of the coupling capacitor $C_C$ is coupled to a top plate of each of the capacitors in the most significant array portion 12. A variable calibration capacitor $C_{CAL}$ is also provided. In a preferred embodiment, the variable calibration capacitor $C_{CAL}$ is coupled between the coupling capacitor $C_C$ and an AC ground node. In alternate embodiment, the variable calibration capacitor $C_{CAL}$ is coupled in parallel with the coupling capacitor $C_C$. In the preferred embodiment, the variable calibration capacitor $C_{CAL}$ comprises array 26 of calibration capacitors 28a–28n, each associated with a switch element 30a–30n. The array 26 may be a binary weighted array.

22 Claims, 5 Drawing Sheets

CIRCUIT AND METHOD FOR TUNING CAPACITOR ARRAYS

FIELD OF THE INVENTION

This invention generally relates to semiconductor devices and circuits and specifically to a circuit and method for tuning capacitor arrays such as in A/D or D/A converters.

BACKGROUND OF THE INVENTION

An MOS device, used as a charge switch, has inherently zero offset voltage and as an amplifier has very high input resistance. In addition, capacitors are easily fabricated in integrated circuit technology. Therefore, one is led to use capacitors rather than resistors as the precision components in an analog-to-digital (A/D) or digital-to-analog (D/A) converter and to use charge rather than current as the working medium. This technique is referred to as charge-redistribution. A plurality of capacitors can be used as the precision elements of an array and have values equal to C, C/2, C/4, C/8, etc. The accuracy of the A/D (A/D will be used solely henceforth, but will be meant to include both A/D and D/A) converter using the charge redistribution technique is mainly determined by the matching of the capacitors in the array.

Experimentally, it has been shown that in fabricating the capacitors utilizing MOS technology, acceptable ratio matching accuracies of up to about 10 bits can be obtained with good yields. However, to achieve accuracy greater than about 10 bits, external means such as laser trimming is required to change the size and value of the capacitors as required which, in turn, will increase the typical yield. However, laser trimming is a very expensive and time consuming procedure.

A method and apparatus which corrects for errors produced in data acquisition systems is disclosed in U.S. Pat. No. 4,399,426. The '426 patent discloses a method and circuit for correcting errors, such as mismatch between binary weighted capacitors and offset, in a charge redistribution, weighted capacitor array analog-to-digital converter. A self-calibrating, self-correcting circuit is comprised of a second binary array of capacitors which adds to the regular charge redistribution capacitor array an error correcting signal to compensate for the mismatch. This error correcting signal is then stored and the other error correcting signals for other capacitors in the regular capacitor array are determined and subsequently stored for later correction of other capacitance mismatch.

SUMMARY OF THE INVENTION

Other objects and advantages will be obvious, and will in part appear hereinafter and will be accomplished by the present invention which provides a circuit and method for tuning capacitor arrays such as in A/D or D/A converters.

A capacitor array circuit is disclosed herein. A main capacitor array includes at least a most significant array portion and a least significant array portion. A coupling capacitor is formed between the two portions of the array. Typically, one plate of the coupling capacitor coupled to a top plate of each of a plurality of capacitors in the least significant array portion and a second plate of the coupling capacitor coupled to a top plate of each of a plurality of capacitors in the most significant array portion. A variable calibration capacitor is also provided. In a preferred embodiment, the variable calibration capacitor is coupled between the coupling capacitor and an AC ground node. In alternate embodiment, the variable calibration capacitor is coupled in parallel with the coupling capacitor. In the preferred embodiment, the variable calibration capacitor comprises array of calibration capacitors, each associated with a switch element. The array may be a binary weighted array.

An advantage of the present invention is that multiple bit precision A/D converters are possible. These devices can be formed using tunable components so that fabrication variations can be compensated.

In addition, the stray or parasitic capacitances can be measured and compensated subsequent to packaging. This provides an advantage over techniques which tune at the wafer stage since the packaging and bond wiring may affect the parasitic capacitances. Still further, in some embodiments, if the capacitances change over time, the circuit may be recalibrated.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of the circuit and method of the present invention. A brief description of conventional analog-to-digital (or digital-to-analog) converters will be described first. The preferred embodiment will then be described followed by a description of modifications. The method of using the invention will then be described.

In switched capacitor circuits, the accuracy of the circuit (e.g., filter transfer function accuracy or analog-to-digital and digital-to-analog accuracy) depends upon capacitor ratios. In order to maximize the ratio accuracy, capacitors are usually comprised of identical unit capacitors. For example, if a ratio of 256:3 were desired, one capacitor would consist of 256 unit capacitors, and the other capacitor would consist of 3 unit capacitors.

Figure 1A:
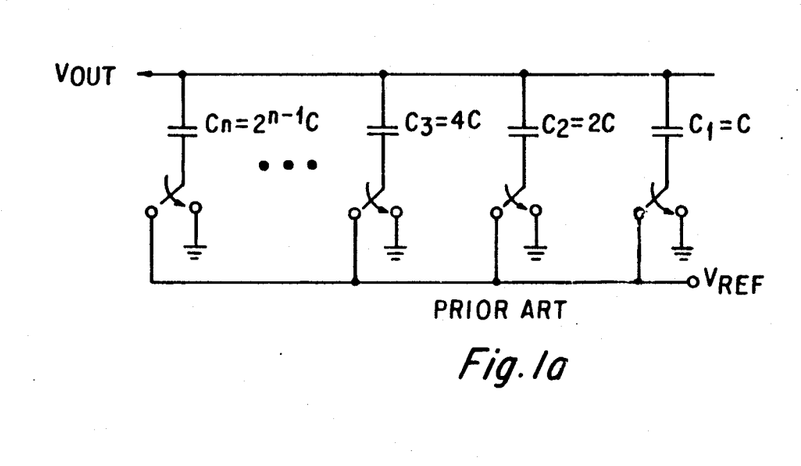
FIGS. 1a and 1b illustrate conventional capacitor arrays.

In linear A/D (analog-to-digital) and D/A (digital-to-analog) converters, the desired ratios are powers of 2. An example of the capacitor array of a linear A/D converter is illustrated in FIG. 1a. An eight bit A/D, for example, is composed of eight capacitors. The LSB (least significant bit) capacitor comprises one (or $2^0$) unit capacitor; the second LSB capacitor comprises two (or $2^1$) unit capacitors; the third LSB capacitor comprises four (or $2^2$) unit capacitors; and so on. Following the sequence, the MSB (most significant bit or in other words, the eighth LSB) capacitor comprises 128 (or $2^7$) unit capacitors. Thus the total array requires $2^8 - 1$ unit capacitors. A/D and D/A converters with resolution well beyond 8 bits require an impractically large number of unit capacitors. One of the problems is that the total capacitance becomes so large that the input signal source and reference voltage source cannot drive the array at a reasonable speed. Typically, the unit capacitor size cannot be reduced because ratio accuracy would be comprised. So an alternative to a simple parallel array, like the one shown in FIG. 1a is required.

Figure 1B:
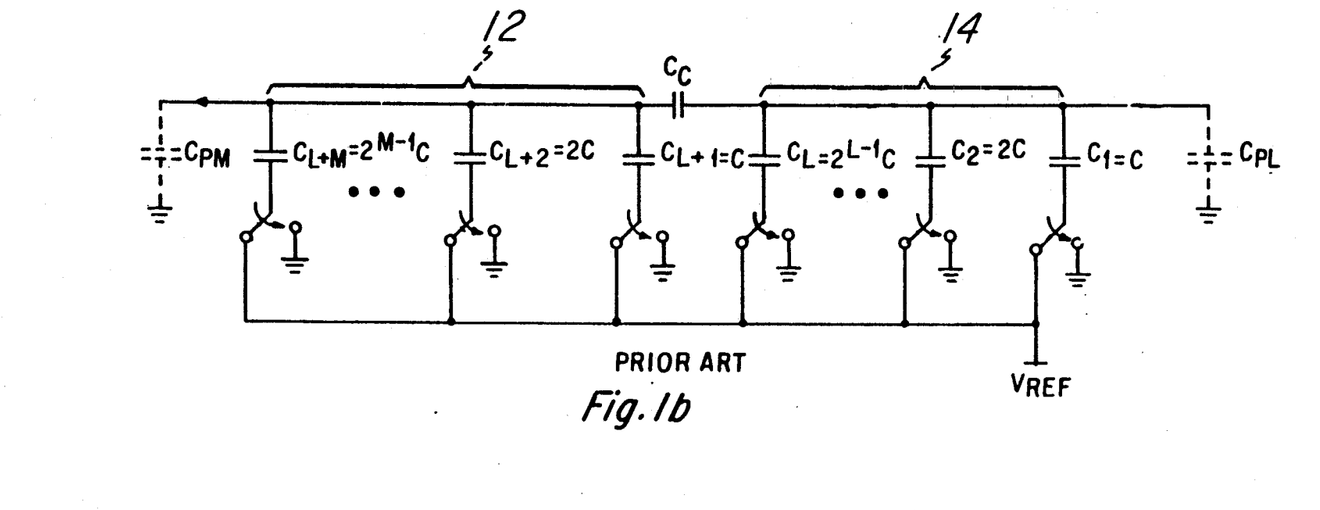

An alternative, illustrated in FIG. 1b is sometimes called a "series-coupled array". In this circuit, the array is divided into a most significant portion 12 which includes a number M capacitors and a least significant portion 14 which includes L capacitors. As shown, the LSB capacitor of each portion comprises one unit capacitor, the second LSB capacitor of each portion comprises two unit capacitors and so on. The size of the unit capacitor may be the same for the two portions or may be different for each portion.

The portions 12 and 14 are coupled together by coupling capacitor $C_C$. The top plate of coupling capacitor $C_C$ is coupled to the top plates of each of the capacitors $C_1$ to $C_L$ in the least significant portion 14 of the array and the bottom plate of coupling capacitor $C_C$ is coupled to the top plates of each of the capacitors $C_{L+1}$ to $C_{L+M}$ in the most significant portion 12 of the capacitor array.

In the ideal case, the value of the coupling capacitor $C_C$ would be:

$$C_C = \frac{C_{LTOT}}{2^L - 1}$$

where $C_{LTOT}$ is the total capacitance in the least significant portion 14 of the capacitor array or the sum of the capacitances of capacitors $C_1$ through $C_L$ (i.e., the parallel combinations of the capacitors).

However, in more practical applications, the coupling capacitance $C_C$ also depends upon the parasitic capacitances. As shown in FIG. 1b, a parasitic capacitance $C_{PL}$ will be associated with the least significant portion 14 of the capacitor array and another parasitic capacitance $C_{PM}$ will be associated with the most significant portion 12 of the capacitor array.

Taking the parasitic capacitance $C_{PL}$ and $C_{PM}$ into account, it can be determined that the value of the coupling capacitance $C_C$ is $$C_C = C_{UM} \left[ \frac{(2^L - 1) C_{UL} + C_{PL}}{2^L C_{UL} - C_{UM}} \right]$$

where $C_{UM}$ is the unit capacitance in the most significant portion 12 of the capacitor array and $C_{UL}$ is the unit capacitance on the least significant portion 14 of the capacitor array. If the unit capacitance $C_{UM}$ for the most significant portion 12 is equal to the unit capacitance $C_{UL}$ for the least significant portion 14 then the coupling capacitance $C_C$ simplifies to $$C_C = \frac{C_{LTOT} + C_{PL}}{2^L - 1}$$

The equation for the coupling capacitor $C_C$ shows the functional dependence of $C_C$ upon the parasitic capacitance $C_{PL}$. In one aspect, the idea presented herein is to use a variable parasitic capacitance (possibly comprised of another array of capacitors) to adjust the effective size of the coupling capacitor $C_C$. In another, more preferred embodiment, the effective size of the parasitic capacitance $C_{PL}$ is varied to attain the desired capacitance ratios.

Increasing the parasitic capacitance $C_{PL}$ requires that the coupling capacitance $C_C$ be increased in order to maintain the desired linearity. Thus, with a fixed coupling capacitance $C_C$ the gain is decreased by increasing parasitic capacitance $C_{PL}$ and increased by decreasing parasitic capacitance $C_{PL}$.

Figure 2:
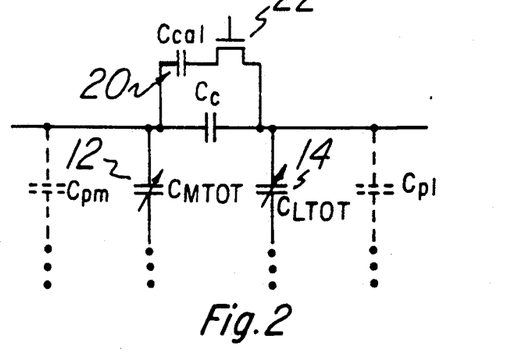
FIG. 2 shows a first embodiment circuit including a calibration capacitor.

A first example of a circuit which allows adjustment of the coupling capacitor $C_C$ is illustrated in FIG. 2. Here, a calibration capacitor 20 is included in series with a switch 22. The switch element 22 may comprise an insulated gate field effect transistor, as an example. Alternatively, the switch element may comprise a fuse (or antifuse). The calibration capacitor 20 and the transistor 22 are formed in parallel with the coupling capacitor $C_C$. The calibration capacitor can be switched on or off as desired to vary the effective capacitance of the coupling capacitor.

Figure 3:
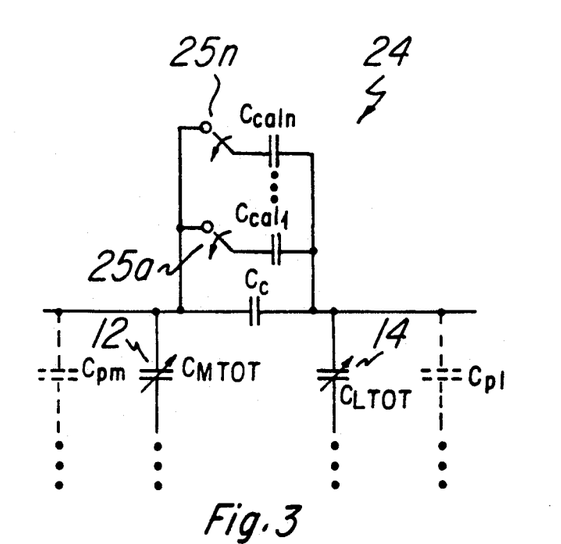
FIG. 3 shows a second embodiment circuit including a calibration capacitor array.

The concept illustrated in FIG. 2 can be extended as illustrated in FIG. 3. As illustrated in FIG. 3, the calibration capacitor comprises an array 24 of capacitors. The array can be a binary weighted array if desired. In this example, there is a switch 25a . . . 25n associated with each calibration capacitor $C_{cal1}$ . . . $C_{calN}$. Each calibration capacitor can be selectively included or excluded to attain the desired effective coupling capacitance.

The embodiments shown in FIGS. 2 and 3, however, have several drawbacks. In many cases, it is necessary to trim the coupling capacitance by only a few percent. In these cases, it is difficult to fabricate capacitors that are very small. In addition, the transistor switch 22 may typically have some current leakage and an associated loss of accuracy. As a result, although the circuits illustrated in FIGS. 2 and 3 may be acceptable in some applications, there are other applications where different approach may be preferable. One such approach is illustrated in FIG. 4.

Figure 4:
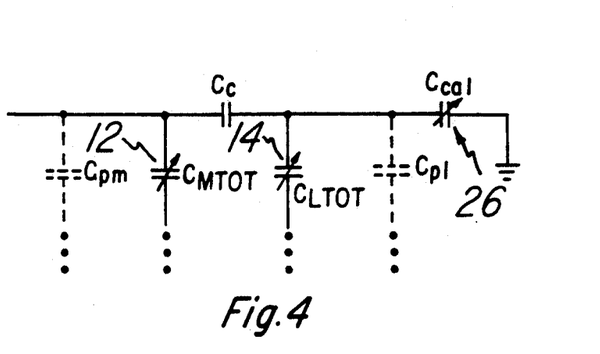
FIG. 4 illustrates a schematic circuit of the preferred embodiment.

Referring now to FIG. 4, the preferred embodiment of the present invention is illustrated in schematic form. A calibration capacitor 26, or array of capacitors, is included. The top plate of the calibration capacitor 26 is coupled to one plate of the coupling capacitor $C_C$ as well as the top plates of the capacitors in the least significant portion 14 of the main capacitor array. The bottom plate of the calibration capacitor 26 is coupled to an AC ground node. One concept here is to include additional stray capacitance which can be controlled. The nominal coupling capacitance $C_C$ can then be designed such that variations will be compensated for by the variable calibration capacitances $C_{cal}$.

Figure 5:
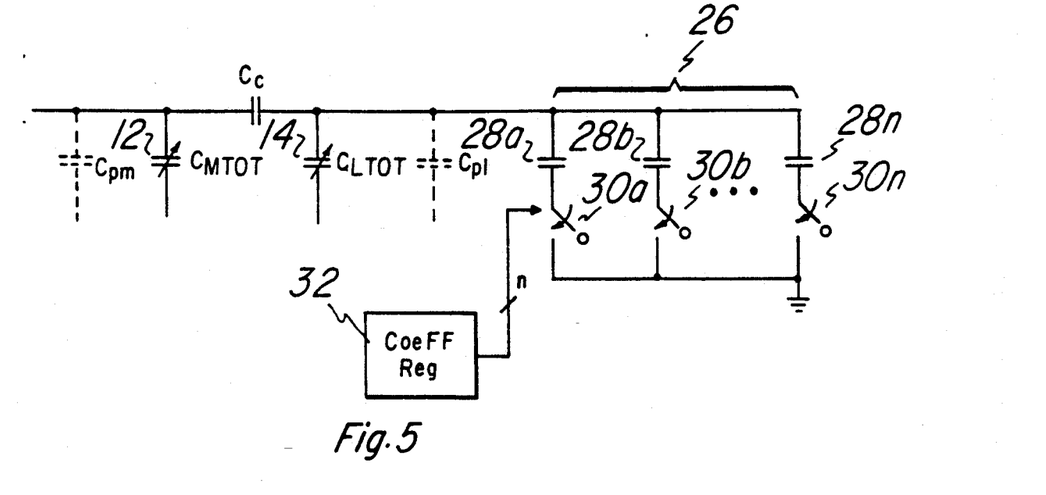
FIG. 5 illustrates a more specific implementation of the preferred embodiment circuit.

A preferred implementation of the preferred embodiment is illustrated in FIG. 5. In this case, the variable capacitor 26 comprises an array of capacitors 28a through 28n. The array of capacitors 28a through 28n may be a binary weighted array. Associated with each capacitor in the array 26 is a switch 30a through 30n. The switch 30a may comprise a field effect transistor (e.g., an n-channel metal oxide semiconductor or NMOS transistor), a complementary MOS transistor device, a non-volatile memory such as an electrically erasable programmable read only memory or an erasable programmable read only memory or a fuse (or antifuse). In one embodiment, the calibration capacitors 28 comprise antifuse; and therefore, no additional switch is needed. Other switch methods such as laser blown links may be used but are not preferred since it is desirable to perform the calibration after packaging.

The switches 30a through 30n may be controlled by the contents of a calibration coefficient register 32. The coefficient register 32 may comprise a memory device such as a random access memory, a read only memory, a programmable read only memory, an erasable programmable read only memory, or an electrically erasable programmable read only memory, as examples.

The switches 30a through 30n either close to connect the corresponding capacitor 28 to AC ground or remain open to allow the corresponding capacitor to "float." When a switch 30 is open, the contribution to the parasitic capacitance is typically about 10% of its value when the same switch is closed. This rule of thumb will vary depending on the technology used to form the switch.

In the preferred embodiment, the coupling capacitor $C_C$ is designed such that initially half of the calibration array will be grounded and half will be floating. Thus, changes up or down in the contents of the calibration register (which nominally begins with contents of 100 . . . 00) can decrease or increase the effective size of the coupling capacitor $C_C$ from its nominal value to compensate for process variations.

An algorithm can be used to determine the correct contents of the calibration coefficient register 32. In one such algorithm, the first step is to measure the differential non-linearity (DNL) at the $(2_L - 1)$ to $2_L$ code transition. This task can be done using, for example, a self-calibration technique such as the one described in U.S. Pat. No. 4,399,426 which is incorporated herein by reference.

If the differential non-linearity is positive, the contents of the coefficient register 32 are decreased. This decreases the effective value of the parasitic capacitance $C_{PL}$ and in turn increases the effective size of the coupling capacitance $C_C$. On the other hand, if the differential non-linearity is negative, the contents of the coefficient register 32 are increased. This increase will cause the effective value of the parasitic capacitance $C_{PL}$ to increase and in turn decreases the effective size of the coupling capacitance $C_C$.

There are many other possible algorithms which can determine the correct contents of the coefficient register 32.

Figure 6:
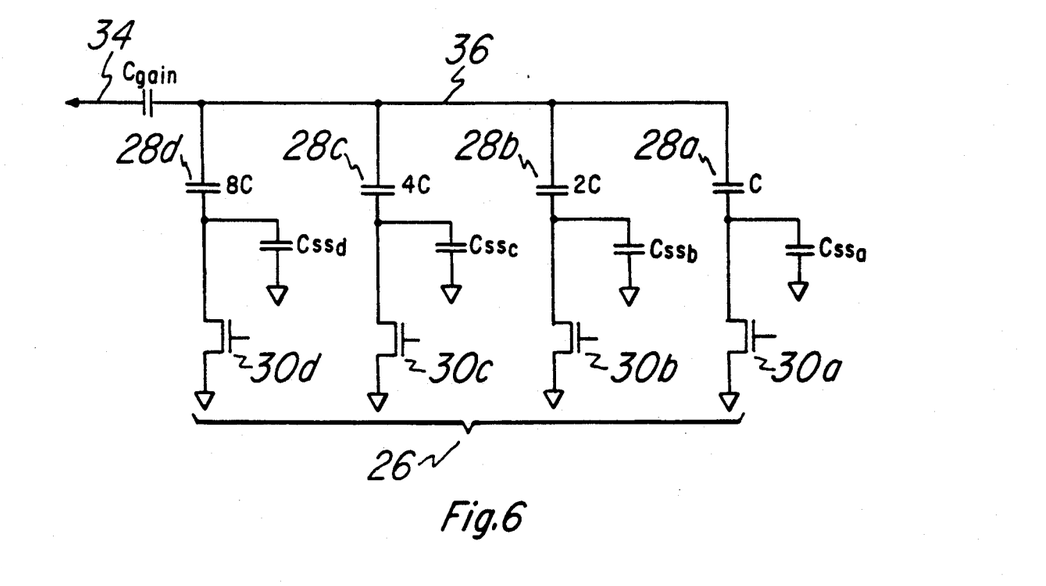
FIG. 6 illustrates a circuit to provide the switching of the trim array.

There are certain circuit techniques which may enhance the operation of the trimming capacitor. To aid in illustration, simple calibration circuit 26 is shown in FIG. 6. A 4-bit trim array 26 is shown with a capacitor $C_{gain}$ that couples to node 34 which comprises the top plates of the capacitors in the most significant portion 12 of the main capacitor array (which is not shown in FIG. 6). The trim array capacitors 28a-28d (referred to herein after as capacitor 28) are switched in with the n-channel switches 30a-30d (referred to herein after as switch 30) in order to adjust the stray capacitance on node 34. Switches 30 are shown here as n-channel transistors but other types of switching devices (including p-channel devices) may also be used. Each n-channel switch 30 disconnects an associated capacitor bottom plate from ground and so reduces the capacitances on node 36 from nC to $(n\, C\, C_{ss})/(nC + C_{ss})$, where $C_{ss}$ is the stray on the bottom plate node for each capacitor 28. Instead of the exact binary weighting illustrated in FIG. 6, the array 26 is adjusted to take this stray capacitance effect into account. In many applications, high precision may not be required since only small corrections are being made to node 34 and therefore the stray capacitance may have little effect.

Figure 7A:
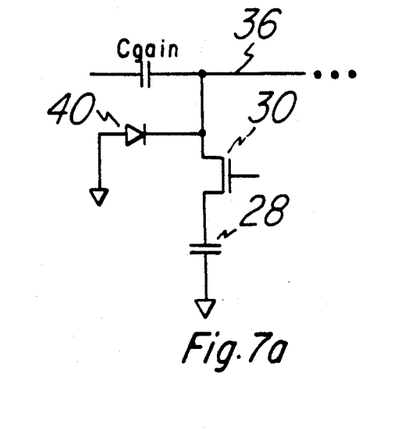
FIGS. 7a and 7b show schematics of two possible locations of a switch element.

The location of switch 30 may affect the operation of the circuit. The switches 30 are not typically put between node 36 and the capacitor 28 because the potential at node 36 is indeterminate, or at least is not controlled. This unpreferred configuration is illustrated in FIG. 7a. During conversion in the A/D converter, the voltage at node 36 changes and could forward bias the switch 30 source/drain diode, shown symbolically as diode 40. The consequent loss of charge on node 36 would affect the accuracy of the conversion.

Figure 7B:
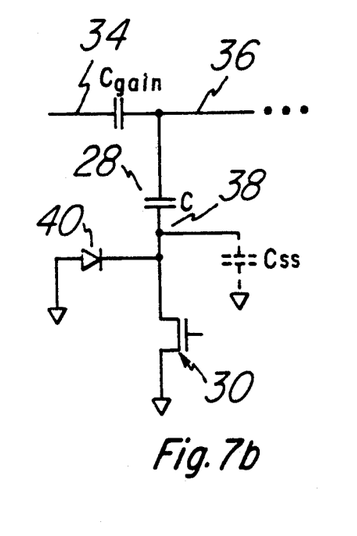

There is a similar problem when the switch 30 is connected to the bottom plate of capacitor 28 as shown in FIG. 7b. If the switch 30 is off so that the capacitor 28 is disconnected, the source/drain diode 40 node 38 will follow the voltage excursions of node 36. Node 38 will normally settle to the ground potential via leakage of the source/drain diode 40. A negative excursion of node 36 then can depress node 38 below ground and turn the diode on and the capacitor bottom plate is effectively connected to ground just as if the switch had been turned on.

Figure 8:
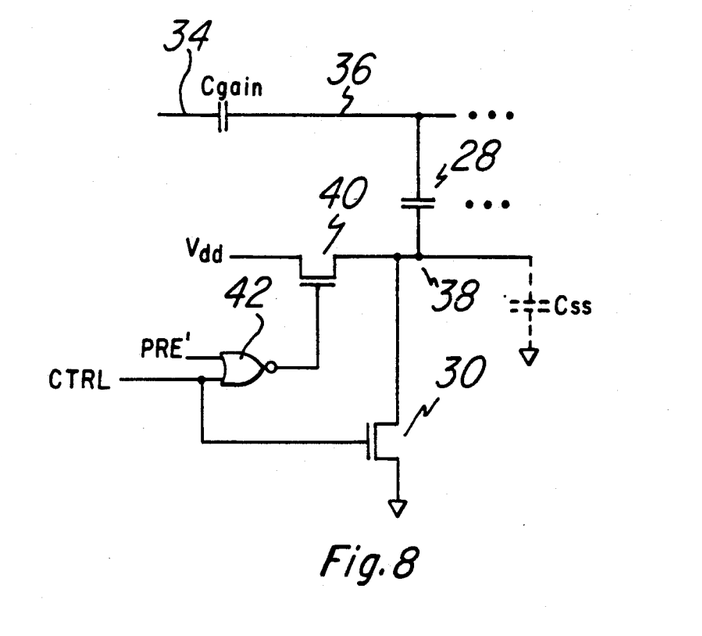
FIG. 8 illustrates an alternate embodiment for a calibration capacitor.

Referring now to FIG. 8, another circuit modification is illustrated. This circuit prevents the leakage problem by precharging node 38 to a positive potential $V_{dd}$. Whenever a capacitor 28 is deselected by the control signal CTRL (i.e., CTRL=0), the precharge signal PRE' is gated (e.g., through NOR gate 42) to a precharge field effect transistor 40. In an embodiment which uses a coefficient register 32 (as illustrated in FIG. 5, for example), the control signal CTRL is supplied by the coefficient register 32. Before each conversion of the A/D converter, a precharge pulse is generated and node 38 is pulled positive to $V_{dd} - V_t$. Subsequent excursions of node 36 cannot depress node 38 below ground and the capacitor 28 remains deselected.

Figure 9:
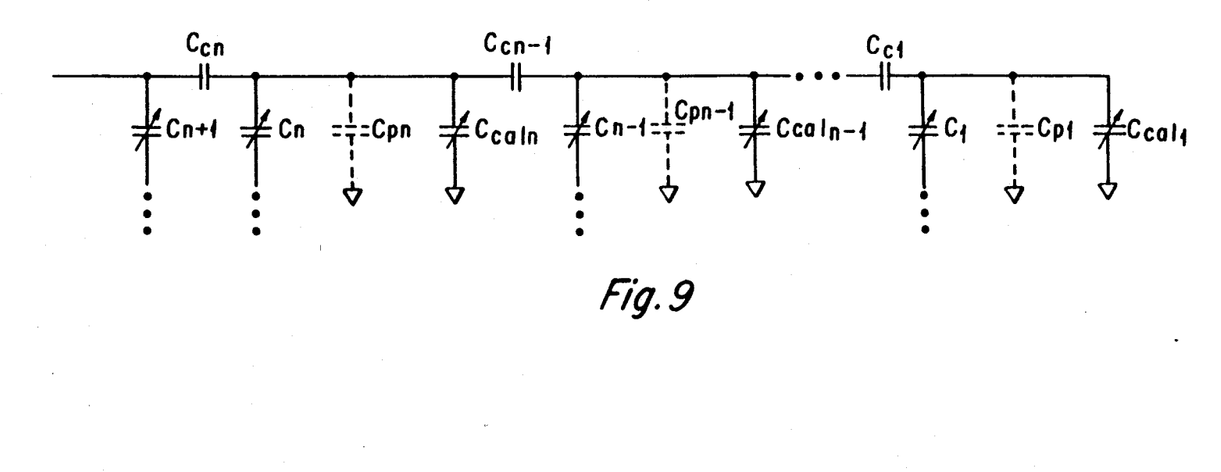
FIG. 9 illustrates a variation of the preferred embodiment circuit.

It should also be noted that the technique of the present invention is not limited to arrays with a single coupling capacitor. In general, one can use n coupling capacitors $C_{C1}$ through $C_{Cn}$ and calibration arrays $C_{CAL1}$ through $C_{CALn}$ in a circuit which includes n+1 main capacitor arrays $C_1$ through $C_{n+1}$. A general schematic diagram is shown in FIG. 9. The implementation of FIG. 9 is an extension of the concepts discussed with respect to FIG. 4 (as well as the other figures). Although not illustrated, the concepts of FIGS. 2 and 3 may also be extended to circuits with multiple coupling capacitors.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
   a main capacitor array including a most significant array portion and a least significant array portion;
   a coupling capacitor, a first plate of said coupling capacitor coupled to a top plate of each of a plurality of capacitors in said least significant array portion and a second plate of said coupling capacitor coupled to a top plate of each of a plurality of capacitors in said most significant array portion; and
   a variable calibration capacitor, a first plate of said variable calibration capacitor coupled to said second plate of said coupling capacitor and a second plate of said variable calibration capacitor coupled to an AC ground node, wherein said variable calibration capacitor comprises an array of calibration capacitors, each said capacitors in said array associated with a switch element coupled to said associated capacitor to switch said associated capacitor to either said AC ground node or an unconnected condition; and
   precharge circuitry coupled to selectively control the voltage at a node between each said switch element and said associated capacitor.

2. The circuit of claim 1 wherein said array of calibration capacitors comprises a binary weighted array.

3. The circuit of claim 1 wherein said switch element comprises a transistor device.

4. The circuit of claim 3 wherein said switch element comprises a n-channel metal oxide semiconductor transistor.

5. The circuit of claim 1 wherein said switch element comprises a non-volatile transistor.

6. The circuit of claim 1 wherein said switch element comprises a fuse or an antifuse.

7. The circuit of claim 1 and further comprising a coefficient register including a plurality of outputs, one each of said outputs coupled to a control input of one of said switch elements.

8. The circuit of claim 1 wherein each said switch element is coupled between said associated capacitor and said AC ground node.

9. The circuit of claim 1 wherein said circuit is formed within an analog-to-digital converter.

10. The circuit of claim 1 wherein said circuit if formed within a digital-to-analog converter.

11. The circuit of claim 1 wherien said precharge circuitry comprises:
    a precharge switching element coupled between a supply voltage node and said node between each said switch element and said associated calibration capacitor; and
    a logic gate with an output coupled to a control input of said precharge switching element.

12. The circuit of claim 11 wherein said precharge switching element comprises a field effect transistor.

13. The circuit of claim 11 wherein said logic gate comprises a NOR gate.

14. A capacitor array circuit comprising:
    a main capacitor array including a most significant array portion and a least significant array portion;
    a coupling capacitor, a first plate of said coupling capacitor coupled to a top plate of each of a plurality of capacitors in said least significant array portion and a second plate of said coupling capacitor coupled to a top plate of each of a plurality of capacitors in said most significant array portion;
    a variable calibration capacitor, a first plate of said variable calibration capacitor coupled to both said first plate of said coupling capacitor and said top plate of each of said plurality of capacitors in said least significant array portion and a second plate of said variable calibration capacitor coupled to both said second plate of said coupling capacitor and said top plate of each of a plurality of capacitors in said most significant array portion.

15. The circuit of claim 14 wherein said varibale calibration capacitor comprises a capacitor coupled in series with a switching element.

16. The circuit of claim 14 wherein said variable calibration capacitor comprises a calibration array comprising a plurality of calibration capacitors, each said calibration capacitors coupled in series with an associated switching element.

17. The circuit of claim 6 wherein said calibration capacitor array comprises a binary weighted array.

18. A method of tuning an array of capacitors comprising the steps of:
    providing a main capacitor array including a most significant array portion and a least significant array portion;
    providing a coupling capacitor, a first plate of said coupling capacitor coupled to a top plate of each of a plurality of capacitors in said least significant array portion and a second plate of said coupling capacitor coupled to a top plate of each of a plurality of capacitors in said most significant array portion;
    providing an array of calibration capacitors, a first plate of each of said calibration capacitors coupled to said second plate of said coupling capacitor and a second plate of each of said calibration capacitors coupled to an associated switch element; and
    switching each said associated switch elements such that said associated calibration capacitor second plate is coupled to either an AC ground node or an unconnected position; and
    providing precharge circuitry coupled to selectively control the voltage at a node between each said switch element and said associated calibration capacitor.

19. The method of claim 18 wherein said array of calibration capacitors comprises a binary weighted array.

20. The method of claim 18 wherein said switching step comprises switching the conductivity of transistor devices.

21. The method of claim 18 wherein said switching step comprises blowing a fuse or an antifuse.

22. The method of claim 8 and further comprising the step of storing a plurality of calibration coefficients in a coefficient register including a plurality of outputs, one each of said outputs coupled to a control input of one of said switch elements.

* * * * *

UNITED STATES PATENT AND TRADEMARK OFFICE
CERTIFICATE OF CORRECTION

PATENT NO : 5,235,335

DATED : August 10, 1993

INVENTOR(S) : Richard K. Hester et al.

It is certified that error appears in the above-identified patent and that said Letters Patent is hereby corrected as shown below:

```
Col. 7, line 27
  replace ''said second plate of said coupling capacitor''
  with --said first plate of said coupling capacitor--.
Col. 8, line 45
  replace ''said second plate of said coupling capacitor''
  with --said first plate of said coupling capacitor--.
```

Signed and Sealed this

Twenty-seventh Day of October, 1998

Attest:

BRUCE LEHMAN

Attesting Officer    Commissioner of Patents and Trademarks